(12) United States Patent
van Wanum

(10) Patent No.: US 9,148,137 B2
(45) Date of Patent: Sep. 29, 2015

(54) RF DEVICE WITH A TRANSMIT/RECEIVE SWITCH CIRCUIT

(75) Inventor: Maurice van Wanum, Delft (NL)

(73) Assignee: NEDERLANDSE ORGANISATIE VOOR TOEGEPAST-NATUUR- WETENSCHAPPELIJK ONDERZOEK TNO, Delft (NL)

( * ) Notice: Subject to any disclaimer, the term of this patent is extended or adjusted under 35 U.S.C. 154(b) by 0 days.

(21) Appl. No.: 14/233,643

(22) PCT Filed: Jul. 20, 2012

(86) PCT No.: PCT/NL2012/050525
§ 371 (c)(1),
(2), (4) Date: Feb. 7, 2014

(87) PCT Pub. No.: WO2013/012338
PCT Pub. Date: Jan. 24, 2013

(65) Prior Publication Data
US 2014/0159831 A1    Jun. 12, 2014

(30) Foreign Application Priority Data
Jul. 21, 2011    (EP) ..................................... 11174911

(51) Int. Cl.
| H04B 1/44 | (2006.01) |
| H03K 17/00 | (2006.01) |
| H03K 17/693 | (2006.01) |
| H04B 1/10 | (2006.01) |
| H04B 1/48 | (2006.01) |
| H03K 17/0814 | (2006.01) |

(52) U.S. Cl.
CPC ........ *H03K 17/002* (2013.01); *H03K 17/08142* (2013.01); *H03K 17/693* (2013.01); *H04B 1/109* (2013.01); *H04B 1/48* (2013.01)

(58) Field of Classification Search
CPC ............. H04B 1/44; H04B 1/48; H04B 1/109
USPC ................................................ 455/78, 82, 83
See application file for complete search history.

(56) References Cited

U.S. PATENT DOCUMENTS

| 5,689,818 | A | * | 11/1997 | Caglio et al. ..................... 455/83 |
| 5,969,561 | A | * | 10/1999 | McGillan ....................... 327/308 |
| 7,263,337 | B2 | * | 8/2007 | Struble ........................... 455/78 |
| 2009/0298443 | A1 | * | 12/2009 | Ta et al. ........................... 455/83 |
| 2010/0073066 | A1 | * | 3/2010 | Seshita et al. ................. 327/427 |
| 2011/0076939 | A1 | * | 3/2011 | Sato ................................ 455/39 |

* cited by examiner

*Primary Examiner* — Ping Hsieh
(74) *Attorney, Agent, or Firm* — Hoffman & Baron, LLP

(57) ABSTRACT

A transmit/receive switch circuit has a comprises a controllable transmit section and a controllable receive section, having an output and an input coupled to an RF transmit/receive terminal respectively. The transmit section comprises a first transistor having a main current channel coupled between an RF transmit signal input and the RF transmit/receive terminal. The receive section comprises a first transistor having a main current channel coupled between the RF transmit/receive terminal and a RF receive signal output and a second transistor having a main current channel coupled between the RF receive signal output and ground. A signal that is derived from an RF input signal at the RF transmit/receive terminal is rectified. The rectified signal is used to control a control electrode of the second transistor of the receive section to make this transistor increasingly conductive with increasing RF signal amplitude. The rectified signal may also be used to control a control electrode of the first transistor of the transmit section in this way. Thus, the transmit/receive switch circuit is made to perform a limiting function.

11 Claims, 3 Drawing Sheets

RF DEVICE WITH A TRANSMIT/RECEIVE SWITCH CIRCUIT

This application is the U.S. National Phase of, and Applicants claim priority from, International Patent Application Number PCT/NL2012/050525 filed 20 Jul. 2012, which claims priority from EP 11174911.5 filed 21 Jul. 2011, each of which is incorporated herein by reference.

BACKGROUND

1. Field

The invention relates to an RF device with a transmit/receive switch circuit.

2. Description of the Related Art

U.S. Pat. No. 5,689,818 discloses a transmit/receive switch circuit, i.e. a circuit that is able both to transmit signals to a terminal and receive signals from that terminal called a transmit/receive terminal. This circuit contains an RF transmit signal input; an RF receive signal output and the RF transmit/receive terminal. A transmit section has a first switching transistor between the RF transmit signal input and ground and a first pass switch coupled between the RF transmit signal input and the RF transmit/receive terminal. A receive section has a second pass switch coupled between the RF transmit/receive terminal and the RF receive signal output and a second short switch (switching transistor) between the RF receive signal output and ground. A control circuit controls the first and second short switch and the first and second pass switch.

In the transmit mode the first short switch is open (non-conductive) and the first pass switch is closed (conductive). In this mode the second short switch is closed and the second pass switch is open. In a receive mode the second pass switch is closed and the second short switch is open. In this mode the first short switch is closed and the first pass switch is open. U.S. Pat. No. 5,689,818 uses transistors (FETs) as switches. The control circuit opens and closes these switches by applying control voltages to the control electrodes (gates) of the switches.

U.S. Pat. No. 5,689,818 addresses the problem that the power supply voltage may be insufficient to provide the required control voltages when the power supply voltage is relatively low and the RF voltages are relatively high. U.S. Pat. No. 5,689,818 solves this problem by means of rectifier circuits, each comprising a diode and a capacitor in series. The rectifiers of U.S. Pat. No. 5,689,818 are only used in the transmit mode. A first rectifier circuit is coupled from the RF transmit signal input to the control electrode of the first short switch. This first rectifier circuit helps to lower the control voltage of the first short circuit adaptively with increasing transmit power. In this way the first short switch will not become conductive at high RF transmit power. A second rectifier circuit is coupled from the RF transmit/receive terminal to the control electrode of the second pass switch. This second rectifier circuit helps to lower the control voltage of the second pass circuit adaptively with increasing transmit power. In this way the second pass switch will not become conductive at high RF transmit power.

In the receive mode overload problems may arise when the received signal from the transmit/receive switch circuit is too large for the receiver. It is known to solve such problems by the use of a limiter between the antenna and the receiver. Typically, a limiter may contain a series connection of a limiter diode and a capacitor coupled between said connection and ground.

SUMMARY

Among others, it is an object to provide for limiting in the receive mode with a minimum of circuitry.

According to one aspect an RF device is provided that comprises a transmit/receive switch circuit, the transmit/receive switch circuit comprising a controllable a transmit section and a controllable receive section having an output and an input coupled to an RF transmit/receive terminal respectively, wherein the transmit section comprises a first transistor having a main current channel coupled between an RF transmit signal input and the RF transmit/receive terminal; and the receive section comprises a first transistor having a main current channel coupled between the RF transmit/receive terminal and a RF receive signal output and a second transistor having a main current channel coupled between the RF receive signal output and ground; the transmit/receive switch circuit comprising a rectifier circuit with an input coupled to the RF transmit/receive terminal, or a circuit node that carries an RF signal derived from the RF transmit/receive terminal, and an output coupled to control electrodes of the first transistor of the transmit section and/or the second transistor of the receive section and configured to make the main current channel of the first transistor of the transmit section and/or the second transistor of the receive section increasingly conductive with increasing RF signal amplitude at the RF transmit/receive terminal. In the case of N-channel transistors for example, the rectifier circuit may be configured to raise the control voltages at the control electrodes of the transistors with increasing RF amplitude.

When an output of the rectifier circuit is coupled to the control electrode of the first transistor of the transmit section, RF output amplitude will be limited because this transistor will divert increasingly more current from the receive section. In this way, the receive section is made to perform part of the limiting function, so that more received RF power can be handled with the same circuit. When an output of the rectifier circuit is coupled to the control electrode of the second transistor of the receive section, RF output amplitude will be limited because this transistor acts increasingly as a short circuit. When connections from the rectifier circuit to both the control electrode of the first transistor of the transmit section and the control electrode of the second transistor of the receive section are used a twofold limiting effect is achieved, reducing RF signal power dissipation by the individual transmit and receive sections.

In an embodiment the rectifier circuit comprises a control node coupled to the control electrodes of the first transistor of the transmit section and/or the second transistor of the receive section;

a capacitor coupled between the control node and the RF transmit/receive terminal, or the circuit node that carries an RF signal derived from the RF transmit/receive terminal;

a diode coupled from the control node to a circuit node configured to supply a constant voltage at least while the receive section is switched on.

The circuit node may be a control input for example, from which control voltages are applied to the control electrode of the first transistor of the transmit section and the control electrode of the second transistor of the receive section to switch to and from a receive mode. Thus, the rectifier circuit is able to track the control voltages. Alternatively, the circuit node may be another node.

The transmit section comprises a second transistor having a main current channel coupled between the RF transmit signal input and ground. In embodiments wherein the output of the rectifier circuit is coupled to the control electrode of the second transistor of the receive section, this second transistor of the receive section may be used in this way to sink current when a large RF amplitude is received. When the second transistors of both the transmit section and receive section are used to sink current when a large RF amplitude is received a size of the second transistor of the receive section may be larger than that of the second transistor of the transmit section. This improves the trade off between small circuit size and power handling ability.

BRIEF DESCRIPTION OF THE DRAWING

These and other objects and advantageous aspects will become apparent from a description of exemplary embodiments, with reference to the following figures.

DETAILED DESCRIPTION

Figure 1:
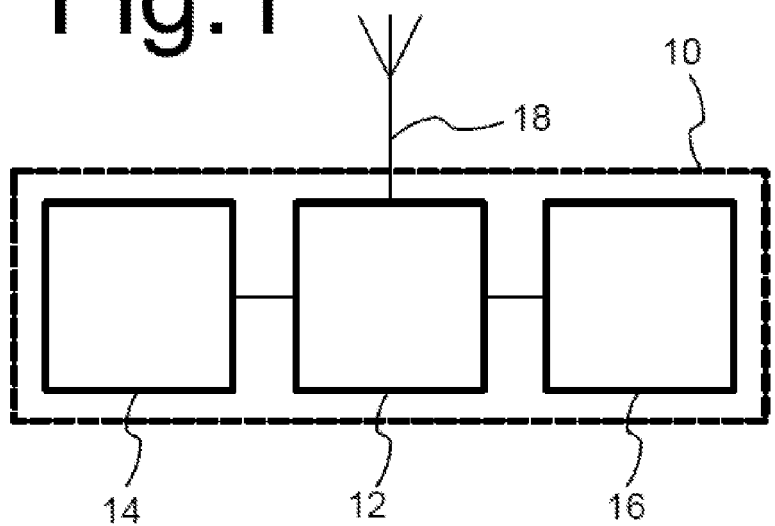
FIG. 1 shows an RF device with a transmit/receive switch circuit
Figure 2:
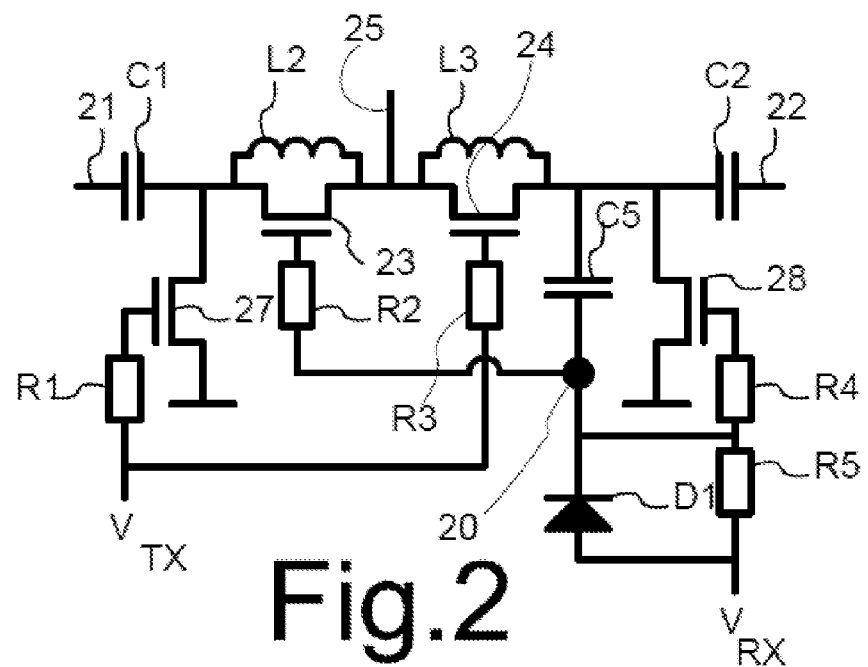
FIG. 2 shows a transmit/receive switch circuit

FIG. 1 shows an RF device 10 comprising a transmit/receive switch circuit 12, coupled to a transmitter 14, a receiver 16 and an antenna 18. FIG. 2 shows a schematic of a transmit/receive switch circuit. The transmit/receive switch circuit has a transmit input 21, a receive output 22, an antenna input/output 25 and a transmit control input $V_{TX}$ and a receive control input $V_{RX}$. Although a circuit with an antenna is shown by way of example, it should be appreciated that a different signal source and sink may be coupled to input/output 25.

Transmit input 21 is coupled to antenna input/output 25 via a transmitter side circuit that comprises an input capacitor C1, an inductance L2 and a first and second transmitter side transistor 23, 27. Transmit input 21 is coupled to antenna input/output 25 via a series arrangement of input capacitor C1 and a main current channel of first transmitter side transistor 23. Inductance L2 is coupled in parallel to the main current channel of first transmitter side transistor 23. A main current channel of second transmitter side transistor 27 is coupled from ground to a node between input capacitor C1 and the main current channel of first transmitter side transistor 23.

Antenna input/output 25 is coupled to receive output 22 via a receiver side circuit that comprises an output capacitor C2 an inductance L3 and a first and second receiver side transistor 24, 28. Antenna input/output 25 is coupled to receive output 22 via a series arrangement of a main current channel of first receiver side transistor 24 and output capacitor C2. Inductance L3 is coupled in parallel to the main current channel of first receiver side transistor 24. A main current channel of second receiver side transistor 28 is coupled from ground to a node between output capacitor C2 and the main current channel of first receiver side transistor 24.

Transmit control input $V_{TX}$ is coupled to control electrodes of second transmitter side transistor 27 and first receiver side transistor 24 via resistors R1, R3 respectively. Receive control input $V_{RX}$ is coupled to control electrodes of first transmitter side transistor 23 and second receiver side transistor 28 via a common resistor R5 to a control node 20. Control node 20 is coupled to a control electrode of first transmitter side transistor 23 via a transmitter control resistor R2. Control node 20 is coupled to a control electrode of second receiver side transistor 28 via a receiver control resistor R4. A capacitor C5 is coupled from control node 20 to a node between output capacitor C2 and the main current channel of first receiver side transistor 24. A diode D1 is coupled in parallel with common resistor R5 from receive control input $V_{RX}$ to control node 20.

In an embodiment, first and second transmitter side transistor 23, 27 and first and second receiver side transistor 24, 28 are N-channel field effect transistors, with negative threshold voltages (normally on type). In this embodiment, the forward current direction of diode D1 is diode D1 is from receive control input $V_{RX}$ to control node 20.

In operation, the transmit/receive switch circuit 12 is switched to a conventional transmit mode by applying a negative voltage to receive control input to transmit control input $V_{TX}$ relative to ground and applying a ground level voltage to receive control input $V_{RX}$. The amplitude of the negative voltage is sufficient to switch off first transmitter side transistor 23.

The DC effect is that second transmitter side transistor 27 will be off (i.e. its main current channel will be substantially non-conductive) and second receiver side transistor 28 will be on (i.e. its main current channel will be conductive, or at least significantly more conductive than second transmitter side transistor 27). Because second receiver side transistor 28 is on, the main current channels of first transmitter side transistor 23 and first receiver side transistor 24 are coupled to ground via second receiver side transistor 28. Hence, the voltages at transmit control input $V_{TX}$ receive control input $V_{RX}$ cause first transmitter side transistor 23 and first receiver side transistor 24 to be on and off respectively.

The RF effect is that an RF signal from transmit input 21 will be transmitted to antenna input/output 25 via first transmitter side transistor 23 and not shunted by second transmitter side transistor 27. RF transmission from antenna input/output 25 to receive output 22 is blocked, because first receiver side transistor 24 is off and second receiver side transistor shunts leakage current past first receiver side transistor 24. In an embodiment, inductance L3 of the receiver side circuit is selected to be resonant with the source drain capacitance of first receiver side transistor 24 at a transmission frequency of transmitter 14 to improve blocking.

The transmit/receive switch circuit 12 is switched to a receive mode by applying the negative voltage to receive control input to transmit control input $V_{RX}$ relative to ground and applying a ground level voltage to receive control input $V_{TX}$. When RF signal amplitudes from antenna input/output 25 are low this has the effect that first and second transmitter side transistors 23, 27 will be off and on respectively, isolating transmit input 21 from antenna input/output 25. Similarly, first and second receiver side transistors 24, 28 will be on and off respectively, coupling antenna input/output 25 to receive output 22. In an embodiment, inductance L2 of the transmitter side circuit is selected to be resonant with the source drain capacitance of first transmitter side transistor 23 at a reception frequency of receiver 16 to minimize antenna signal loss at small signal amplitude.

Diode D1 and bias capacitor C5 provide for an RF amplitude dependent control voltage at the control electrodes of first transmitter side transistor 23 and second receiver side transistor 28. A net rectified voltage will develop over bias capacitor C5, which increases with increasing RF signal amplitude at receive output 22, raising the voltage at control node 20.

Figure 3:
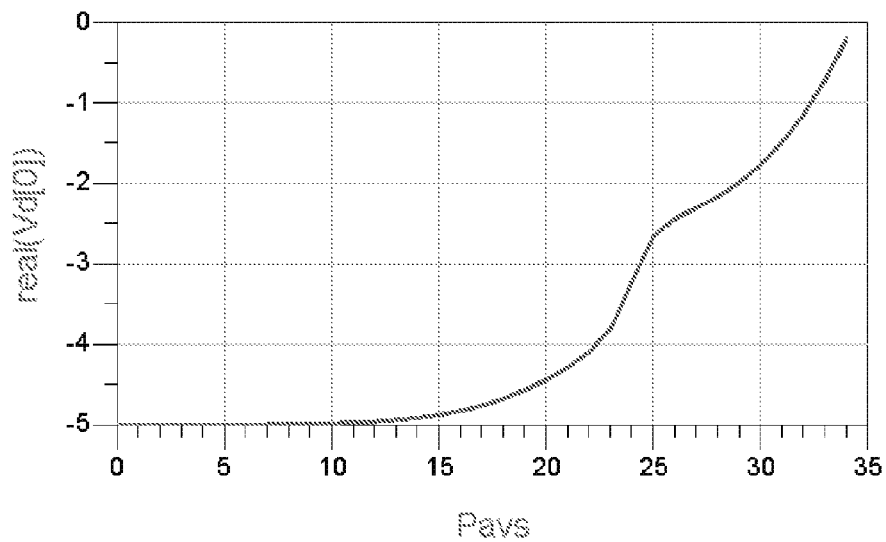
FIG. 3 shows a graph of control voltage vs. RF input amplitude
Figure 4:
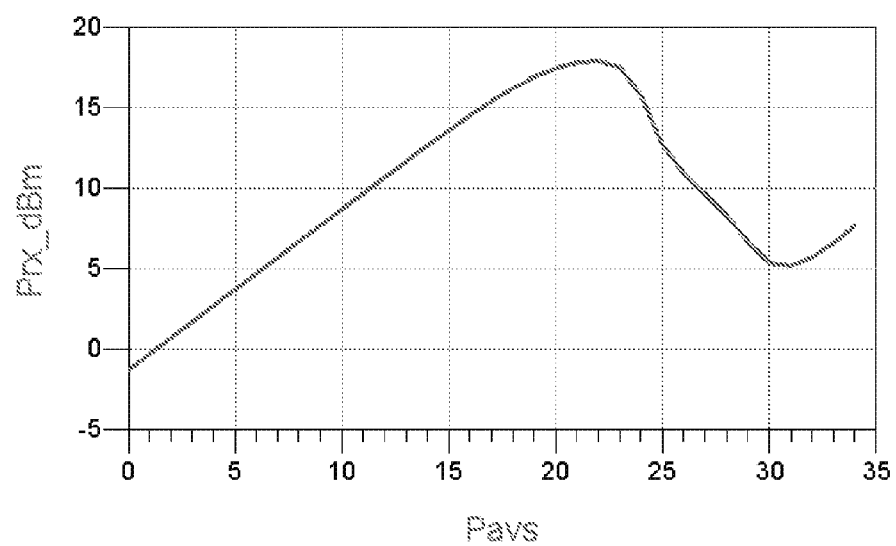
FIG. 4 shows a graph of RF output amplitude RF input amplitude

FIG. 3 shows the voltage at control node 20 as a function of RF input power (arbitrary scale) for an exemplary embodiment. The increasing voltage at control node 20 as a function of RF amplitude has the effect that the electrical resistivity of the main current channels of first transmitter side transistor 23 and second receiver side transistor 28 will decrease with increasing RF signal amplitude. As a consequence, an increasing part of the input signal current from antenna input/output 25 will be deviated to the transmitter side circuit via first and second transmitter side transistors 23, 27, and an increasing part of the RF current in the receiver side circuit will be deviated from receive output 22 by second receiver side transistor 28. In other words, the RF signal current at receive output 22 is limited. FIG. 4 shows RF output power at the receive output 22 as a function of RF input power for an exemplary embodiment. The RF power at the node between first receiver side transistor 24 and bias capacitor C5 levels of with increasing RF input power. The drop in RF output power at receiver output 22 is due to the effect of the circuit between this node and receiver output 22.

Figure 5:
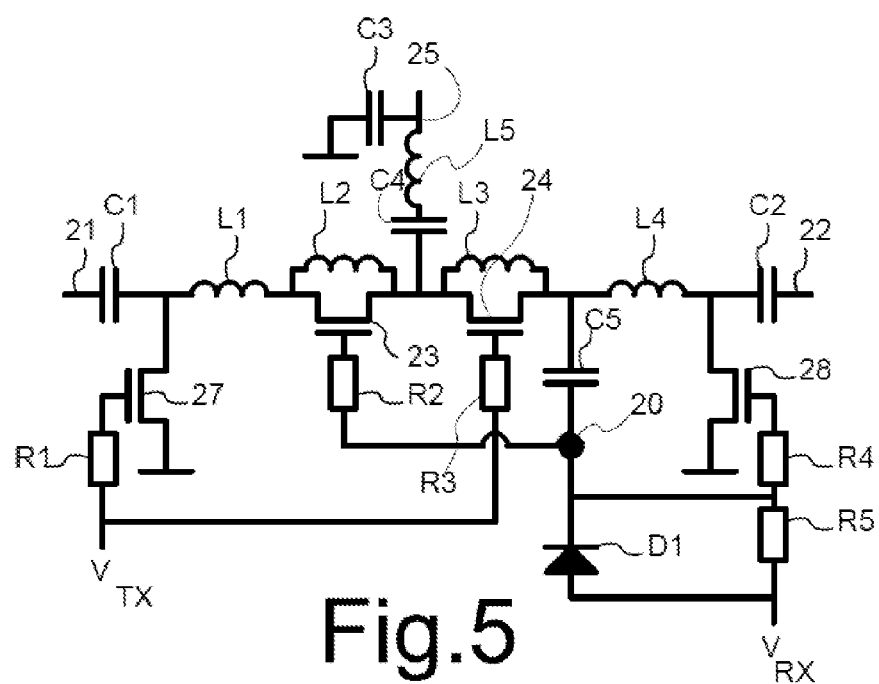
FIG. 5 shows a transmit/receive switch circuit

FIG. 5 shows an embodiment wherein further inductances L1, L2 have been added. A transmitter side further inductance L1 is coupled in series between transmitter input 22 and the main current channel of first transmitter side transistor 23. The inductance value of transmitter side further inductance L1 is preferably selected to tune out the capacitance of input capacitor C1 at the transmission frequency of transmitter 14. Similarly a receiver side further inductance L2 is coupled in series between the main current channel of first receiver side transistor 24. The inductance value of receiver side further inductance L2 is preferably selected to tune out the capacitance of output capacitor C5 at the reception frequency of receiver 16. In the illustrated embodiment, bias capacitor C5 is coupled to a node between the main current channel of first receiver side transistor 24 and further receiver side inductance L4 so that it need not affect tuning. Furthermore in the embodiment of FIG. 5, a series arrangement of an inductance L5 and a capacitance C4 is coupled between the antenna input/output 25 and a node between the main current channels of first transmitter and receiver side transistors 23, 24. Capacitance C4 provides for DC blocking and inductance L5 may be selected to tune out capacitance C4 at an operational RF frequency. Alternatively, inductance L5 could be omitted.

Resistor R5 may be replaced by a controllable high impedance current source circuit, realized for example by connecting the drain of a normally on type FET to control node 20, with its gate connected to VRx and its source connected to Vrx via a resistor. The latter resistor may be much smaller than R5.

Preferably, the size of second receiver side transistor 28 is larger than that of second transmitter side transistor 27. This makes it possible to improve the trade-off between power handling ability and circuit size (e.g. to reduce the size for the same power, or increase the power for the same size), because a larger part of the current will be dissipated on the receiver side. The size of a transmitter is defined herein as the width of its main current channel a direction transverse to the average current direction through the main current channel, or the area of a cross section of the main current channel through a virtual plane transverse to said average current direction at a position of the control electrode.

The resistance value of common resistor R5, combined with the capacitance of bias capacitor C5 determines the bandwidth of the rectifying circuit. The combination or this resistance and capacitance value may be selected according to expected bandwidth of amplitude variations of the antenna signal. As will be appreciated, the resistance values of the resistors coupled to the control electrodes of the transistors are not critical: they mainly serve to counteract RF leakage. The control voltages need not depend significantly on these resistance values.

Although embodiments have been shown bias capacitor C5 is coupled to a node between the main current channels of first receiver side transistor 24 and output capacitor C2 (or inductance L4), it should be appreciated that instead it may be coupled to another node that carries a signal derived from the signal at antenna input/output 25, for example to antenna input/output 25 itself, or to receiver output 22. Connection to receiver output 22 has the advantage that a monotonously increasing RF output signal amplitude can be realized. Use of an internal node behind first receiver side transistor 24 has the advantage that the input/output signals are least affected.

Although embodiments have been shown wherein one terminal of diode D1 is coupled to receive control input $V_{RX}$, it should be appreciated that alternatively this terminal may be coupled to another circuit node, for example a circuit node that always carries the same voltage as the control voltage applied to the receive control input $V_{RX}$ in the receive mode. In an embodiment the voltage at this circuit node may be higher or lower than this control voltage. In this case the limiting effect will set in at a lower or higher RF signal amplitude. Also more than one diode may be used in series with diode D1.

Although embodiments have been shown wherein DC current paths from the main current channels of the first transmitter and receiver side transistors 23, 24 to ground are provided via inductances L2, L3 and second transmitter and receiver side transistors 27, 28, it should be appreciated that other DC path may be used, realized for example by means of resistances. In this case inductances L2 and/or L3 could be omitted. Similarly, input and output capacitances C1, C2 could be omitted, for example if transmitter 14 and receiver 16 do not significantly affect DC settings.

Although an example using N-channel transistors has been shown, it should be appreciated that instead P channel transistors may be used. In this case, the forward direction of diode D1 may be reversed. Although examples using normally on field effect transistors have been shown, it should be appreciated that instead normally off transistors may be used, i.e. in the case of N-channel field effect transistors, transistors that require a positive gate-source voltage to switch on. In this case the control voltages may be adapted accordingly. Although examples using field effect transistors have been shown, it should be appreciated that bipolar transistors may be used instead, the collector-emitter connection forming the main current channel and the base forming the control electrode. In this case, the collector of the first transmitter side transistors 23 and the emitter of the first receiver side transistor 24 may be coupled to the antenna input/output 25 and DC bias circuits may be added.

Although an embodiment has been shown wherein the RF amplitude dependent voltage at control node 20 is used to adapt the control voltage of both first transmitter side transistor 23 and second receiver side transistor 28, it should be appreciated that a limiting effect can be achieved already if the control voltage of only one of these transistors is adapted. One or more voltage divider circuits coupled from the control node 20 to the control electrodes of first transmitter side transistor 23 and/or second receiver side transistor 28 may be used to set the size of the adaptation of the control voltages of these control electrodes.

In an example, if the control electrode of first transmitter side transistor 23 is coupled to receiver control input $V_{RX}$ via a separate resistor, so that it is not affected by the voltage at control node 20, second receiver side transistor 28 will perform an RF amplitude dependent limiting function. As another example, if the control electrode of second receiver side transistor 28 is coupled to receiver control input $V_{RX}$ via a separate resistor, so that it is not affected by the voltage at control node 20, first transmitter side transistor 23 will deviate part of the RF antenna current, which has an RF amplitude dependent limiting effect. In this way the transmitter side circuit, whose normal function is to pass or block RF signals from transmitter 14, can be used for the additional purpose of sinking part of the RF antenna current dependent on RF signal amplitude. In this way the circuit is able to handle larger RF antenna signal amplitudes.

Although embodiments have been shown without measures for RF amplitude dependent operation in the transmit mode, it should be appreciated that the invention is not limited to circuit without such adaptations.

In an embodiment a first and second rectifying circuit may be used for the control electrode of first transmitter side transistor 23 and second receiver side transistor 28, each rectifier circuit comprising its own bias capacitance C5, diode D1 and control node 20, otherwise connected as shown in the figures.

Although embodiments have been shown wherein the control electrode of first receiver side transistor 24 receives an RF amplitude independent control voltage, it should be appreciated that the control voltage of first receiver side transistor 24 may also be adapted, for example, if N channel transistors are used, by lowering its control voltage with increasing RF signal amplitude. The control electrode resistor R3 of first receiver side transistor 24 may be coupled to a further control node for example and transmit control input $V_{TX}$ may be coupled to the further control node via a further resistor. In this case a further bias capacitor may be coupled from the further control node and the node between first receiver side transistor 24 and output capacitor C2. A further diode may be coupled from the further control node to transmit control input $V_{TX}$, with its forward current direction toward transmit control input $V_{TX}$ in the case of N-channel transistors (i.e. opposite compared to diode D1). In this way a further limiting effect may be realized, but the maximum RF power that can be handled could be reduced.

The invention claimed is:

1. An RF device comprising a transmit/receive switch circuit, the transmit/receive switch circuit comprising:
   a controllable transmit section; and
   a controllable receive section having an output and an input coupled to an RF transmit/receive terminal respectively, wherein
      the transmit section comprises a first transistor having a main current channel coupled between an RF transmit signal input and the RF transmit/receive terminal; and
      the receive section comprises a first transistor having a main current channel coupled between the RF transmit/receive terminal and a RF receive signal output and a second transistor having a main current channel coupled between the RF receive signal output and ground;
   the transmit/receive switch circuit comprising:
      a rectifier circuit with an input coupled to the RF transmit/receive terminal, or a circuit node that carries an RF signal derived from the RF transmit/receive terminal, and wherein the rectifier circuit has an output coupled to control electrodes of the first transistor of the transmit section and/or the second transistor of the receive section and configured to make the main current channel of the first transistor of the transmit section and/or the second transistor of the receive section increasingly conductive with increasing RF signal amplitude at the RF transmit/receive terminal.

2. An RF device according to claim 1, wherein the rectifier circuit further comprises:
   a control node coupled to the control electrodes of the first transistor of the transmit section and/or the second transistor of the receive section;
   a capacitor coupled between the control node and the RF transmit/receive terminal, or the circuit node that carries an RF signal derived from the RF transmit/receive terminal; and
   a diode coupled from the control node to a circuit node configured to supply a constant voltage at least while the receive section is switched on.

3. An RF device according to claim 1, wherein the output of the rectifier circuit is coupled to the control electrode of the second transistor of the receive section.

4. An RF device according to claim 1, wherein the output of the rectifier circuit is coupled to the control electrode of the first transistor of the transmit section.

5. An RF device according to claim 4, wherein the transmit section further comprises a second transistor having a main current channel coupled between the RF transmit signal input and ground.

6. An RF device according to claim 5, wherein the transmit/receive switch circuit further comprises:
   a control circuit with a first control input coupled to the second transistor of the receive section and the control electrode of the first transistor of the transmit section; and
   a second control input coupled to the control electrodes of the second transistor of the transmit section and the first transistor of the receive section.

7. An RF device according to claim 1, wherein the output of the rectifier circuit is coupled to the control electrode of the second transistor of the receive section.

8. An RF device according to claim 7, wherein a width of the main current channel of the second transistor of the receive section is larger than that of the second transistor of the transmit section.

9. An RF device according to claim 1, wherein the transmit/receive switch circuit further comprises:
   a control circuit with a first control input coupled to the control electrodes of the first transistor of the transmit section and the second transistor of the receive section; and
   a second control input coupled to the control electrode of the first transistor of the receive section.

10. An RF device according to claim 9, comprising
   a control node coupled to the control electrodes of the first transistor of the transmit section and/or the second transistor of the receive section;
   a capacitor coupled between the RF receive signal output and the control node; and
   a diode coupled from the control node to the first control input.

11. A method of operating a transmit/receive switch circuit, wherein the transmit/receive circuit comprises:
   a controllable transmit section and a controllable receive section having an output and an input coupled to an RF transmit/receive terminal respectively, wherein the transmit section comprises a first transistor having a main current channel coupled between an RF transmit signal input and the RF transmit/receive terminal; and the receive section comprises a first transistor having a main current channel coupled between the RF transmit/receive terminal and a RF receive signal output and a second transistor having a main current channel coupled between the RF receive signal output and ground;

the method comprising in a receive mode:

rectifying a signal derived from an RF input signal at the RF transmit/receive terminal; and using the rectified signal to control electrodes of the first transistor of the transmit section and/or the second transistor of the receive section, to make the main current channel of the first transistor of the transmit section and/or the second transistor of the receive section increasingly conductive with increasing RF signal amplitude at the RF transmit/receive terminal.

* * * * *